US 10,757,870 B2

(12) United States Patent
Millar et al.

(10) Patent No.: US 10,757,870 B2
(45) Date of Patent: Sep. 1, 2020

(54) DEVICES, SYSTEMS, AND METHODS FOR PROVIDING AND USING CROP CONTROL HARDWARE IN A MASTER CONTROLLER IN AN ASSEMBLY LINE GROW POD

(71) Applicant: Grow Solutions Tech LLC, Lehi, UT (US)

(72) Inventors: Gary Bret Millar, Highland, UT (US); Kevin Hurst, Pleasant Grove, UT (US)

(73) Assignee: Grow Solutions Tech LLC, Vineyard, UT (US)

( * ) Notice: Subject to any disclaimer, the term of this patent is extended or adjusted under 35 U.S.C. 154(b) by 247 days.

(21) Appl. No.: 15/926,771

(22) Filed: Mar. 20, 2018

(65) Prior Publication Data

US 2018/0359938 A1  Dec. 20, 2018

Related U.S. Application Data (60) Provisional application No. 62/519,420, filed on Jun. 14, 2017, provisional application No. 62/519,419, (Continued)

(51) Int. Cl.
*A01G 9/24* (2006.01)
*A01G 9/26* (2006.01)
(Continued)

(52) U.S. Cl.
CPC ............... *A01G 9/26* (2013.01); *A01G 7/045* (2013.01); *A01G 9/02* (2013.01); *A01G 9/06* (2013.01);
(Continued)

(58) Field of Classification Search
CPC .... A01G 27/003; A01G 25/16; A01G 25/167; A01G 7/045; A01G 9/26; A01G 9/249;
(Continued)

(56) References Cited

U.S. PATENT DOCUMENTS 4,152,750 A * 5/1979 Bremenour .......... H05K 7/1477
361/679.4
RE31,023 E * 9/1982 Hall, III ................. A01D 46/24
137/236.1
(Continued)

OTHER PUBLICATIONS

International Search Report & Written Opinion dated Jun. 19, 2018 for International Application No. PCT/US2018/024158 filed on Mar. 23, 2018.

*Primary Examiner* — Magdalena Topolski
*Assistant Examiner* — Katelyn T Truong
(74) *Attorney, Agent, or Firm* — Dinsmore & Shohl LLP (57) ABSTRACT

Devices, systems, and methods for providing and operating crop control hardware are provided herein. Some embodiments include an assembly line grow pod having a master controller with a plurality of bays and being communicatively coupled to components of the grow pod, a crop control module within one of the bays such that the crop control module is communicatively coupled to the master controller and the components of the grow pod, and a second control module in one of the bays, which is removably insertable such that it is removable from the bay without altering the assembly line grow pod functionality. The crop control module is programmed to sense a removal of the second control module, determine control signals necessary to maintain an operation of the grow pod and the components of the grow pod, and provide the control signals to the grow pod or the components of the grow pod.

19 Claims, 9 Drawing Sheets

Related U.S. Application Data filed on Jun. 14, 2017, provisional application No. 62/519,428, filed on Jun. 14, 2017, provisional application No. 62/519,430, filed on Jun. 14, 2017, provisional application No. 62/519,421, filed on Jun. 14, 2017, provisional application No. 62/519,425, filed on Jun. 14, 2017, provisional application No. 62/519,321, filed on Jun. 14, 2017, provisional application No. 62/519,343, filed on Jun. 14, 2017, provisional application No. 62/519,316, filed on Jun. 14, 2017, provisional application No. 62/519,607, filed on Jun. 14, 2017, provisional application No. 62/519,329, filed on Jun. 14, 2017, provisional application No. 62/519,330, filed on Jun. 14, 2017.

(51) Int. Cl.
| | |
|---|---|
| *A01G 9/06* | (2006.01) |
| *A01G 27/00* | (2006.01) |
| *G05B 19/042* | (2006.01) |
| *A01G 9/08* | (2006.01) |
| *A01G 7/04* | (2006.01) |
| *A01G 9/02* | (2018.01) |
| *A01G 31/04* | (2006.01) |
| *H05K 7/14* | (2006.01) |

(52) U.S. Cl.
CPC ............. *A01G 9/085* (2013.01); *A01G 9/088* (2013.01); *A01G 9/246* (2013.01); *A01G 9/247* (2013.01); *A01G 27/003* (2013.01); *A01G 31/042* (2013.01); *G05B 19/0421* (2013.01); *H05K 7/1479* (2013.01); *G05B 2219/2231* (2013.01); *G05B 2219/2629* (2013.01); *G05B 2219/45017* (2013.01); *G05B 2219/45106* (2013.01)

(58) Field of Classification Search
CPC . A01G 9/088; A01G 9/02; A01G 9/06; A01G 9/085; A01G 9/246; A01G 9/247; A01G 31/042
See application file for complete search history.

(56) References Cited

U.S. PATENT DOCUMENTS

| | | |
|---|---|---|
| 5,088,231 A | 2/1992 | Kertz |
| 5,262,936 A | 11/1993 | Faris et al. |
| 5,479,338 A | 12/1995 | Ericksen et al. |
| 9,516,822 B2 | 12/2016 | Gonyer et al. |
| 9,538,713 B2 | 1/2017 | Pearson et al. |
| 9,547,313 B2 | 1/2017 | Nickerson et al. |
| 2002/0088173 A1* | 7/2002 | Hessel ............... A01B 79/005 47/60 |
| 2007/0159305 A1* | 7/2007 | Cesar ............... G05B 19/0421 340/10.32 |
| 2014/0108692 A1 | 4/2014 | Doglio et al. |
| 2016/0179734 A1 | 6/2016 | Shih |
| 2016/0270304 A1 | 9/2016 | Higgins |
| 2017/0010652 A1 | 1/2017 | Huang et al. |
| 2018/0098513 A1* | 4/2018 | Ritchie ............... A01G 9/1423 |

* cited by examiner

DEVICES, SYSTEMS, AND METHODS FOR PROVIDING AND USING CROP CONTROL HARDWARE IN A MASTER CONTROLLER IN AN ASSEMBLY LINE GROW POD

CROSS REFERENCE TO RELATED APPLICATION

This application claims the benefit of U.S. Provisional Application Ser. No. 62/519,420, filed on Jun. 14, 2017; U.S. Provisional Application Ser. No. 62/519,419, filed on Jun. 14, 2017; U.S. Provisional Application Ser. No. 62/519,428, filed on Jun. 14, 2017; U.S. Provisional Application Ser. No. 62/519,430, filed on Jun. 14, 2017; U.S. Provisional Application Ser. No. 62/519,421, filed on Jun. 14, 2017; U.S. Provisional Application Ser. No. 62/519,425, filed on Jun. 14, 2017; U.S. Provisional Application Ser. No. 62/519,321, filed on Jun. 14, 2017; U.S. Provisional Application Ser. No. 62/519,343, filed on Jun. 14, 2017; U.S. Provisional Application Ser. No. 62/519,316, filed on Jun. 14, 2017; U.S. Provisional Application Ser. No. 62/519,607, filed on Jun. 14, 2017; U.S. Provisional Application Ser. No. 62/519,329, filed on Jun. 14, 2017; and U.S. Provisional Application Ser. No. 62/519,330, filed on Jun. 14, 2017, which are incorporated by reference in their respective entireties.

TECHNICAL FIELD

Embodiments described herein generally relate to systems and methods for controlling one or more components of an assembly line grow pod and, more specifically, to use of crop control hardware in a modular control interface to control components.

BACKGROUND

Industrial grow pods that are used to continuously grow crops may utilize an assembly line of carts that continuously traverse a track as plant seeds are planted, grown, and harvested, and then continue to traverse the track as the carts (and/or trays thereon) are cleaned and washed to repeat the process. To ensure smooth operation of the industrial grow pod, it may be necessary to ensure that control modules in the industrial grow pod are continuously receiving information and data from various components of the grow pod and continuously provide instructions to various components accordingly, even in instances where certain control modules may be removed for repair, reprogramming, redeployment, and/or the like.

SUMMARY

Devices, systems, and methods for providing and using crop control hardware are disclosed. One embodiment includes an assembly line grow pod having a master controller with a plurality of bays, the master controller communicatively coupled to one or more components of the assembly line grow pod, a crop control module received within a first bay of the plurality of bays of the master controller such that the crop control module is communicatively coupled to the master controller and the one or more components of the assembly line grow pod, and a second control module in a second bay of the plurality of bays, the second control module being removably insertable such that the second control module is removable from the second bay of the plurality of bays without altering a functionality of the assembly line grow pod. The crop control module is programmed to sense a removal of the second control module, determine one or more control signals necessary to maintain an operation of the assembly line grow pod and the one or more components of the assembly line grow pod, and provide the one or more control signals to the assembly line grow pod or the one or more components of the assembly line grow pod.

In another embodiment, a master controller in an assembly line grow pod includes a plurality of bays, each one of the plurality of bays including a bay I/O port that is communicatively coupled to one or more components of the assembly line grow pod, and a crop control module received within a first bay of the plurality of bays of the master controller. The crop control module includes an I/O port communicatively coupled to the bay I/O port, a processing device, and a non-transitory, processor-readable storage medium comprising one or more programming instructions stored thereon. The programming instructions, when executed, cause the processing device to receive an input, determine an action to be completed based on the input, the action including providing one or more instructions or signals for operation of the one or more components of the assembly line grow pod, determine a control module within a second bay of the plurality of bays for completing the action, and transmit an instruction to the control module, the instruction directing the control module to complete the action.

In yet another embodiment, a master controller in an assembly line grow pod includes a plurality of bays, each one of the plurality of bays having a bay I/O port that is communicatively coupled to one or more components of the assembly line grow pod, and a crop control module received within a first bay of the plurality of bays of the master controller. The crop control module includes an I/O port communicatively coupled to the bay I/O port, a processing device, and a non-transitory, processor-readable storage medium having one or more programming instructions stored thereon that, when executed, cause the processing device to receive an input, determine an action to be completed based on the input, the action including providing one or more instructions or signals for operation of the one or more components of the assembly line grow pod, determine that no control module is available or exists within one of the plurality of bays for completing the action, and complete the action.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which.

DETAILED DESCRIPTION

Embodiments disclosed herein include devices, systems, and methods for providing and operating crop control hardware in a modular control interface of a master controller that controls various components of an assembly line grow pod. The assembly line grow pod may be configured with an assembly line of trays holding seeds and/or plants that follow a track. The assembly line grow pod may further include various components that provide water, nutrients, ambient air conditions, lighting, and/or the like to ensure optimum growth of the seeds and/or plants as the trays traverse the track. In addition, the assembly line grow pod may also include various components that monitor for changes in the seed/plant, environmental changes, presence of contaminants, and/or the like. As such, these components of the assembly line grow pod are controlled by a master controller. Specific control of such components may be completed by a plurality of hot-swappable modules that are inserted in a modular control interface of the master controller. In order for the various modules to be hot swappable, the devices, systems and methods described herein are utilized to ensure uninterrupted functioning of the assembly line grow pod when particular modules are removed from the modular control interface of the master controller. As such, the devices, systems, and methods described herein provide functionality to generally control all of the systems in the assembly line grow pod to ensure that the assembly line grow pod continues to function as particular modules are swapped out. The devices, systems, and methods for providing and using crop control hardware in an assembly line grow pod, as well as an assembly line grow pod incorporating the same will be described in more detail below.

While crop growth technologies have advanced over the years, there are still many problems in the farming and crop industry today. As an example, while technological advances have increased efficiency and production of various crops, many factors may affect a harvest, such as weather, disease, infestation, and the like. Additionally, while certain countries may currently have suitable farmland to adequately provide food for certain populations, other countries and future populations may not have enough farmland to provide the appropriate amount of food. As a result, industrial grow pods have been developed that allow for growing of crops in a smaller amount of space than what would typically be required of a farm. However, improvement of the various components of the industrial grow pod is needed.

Figure 1:
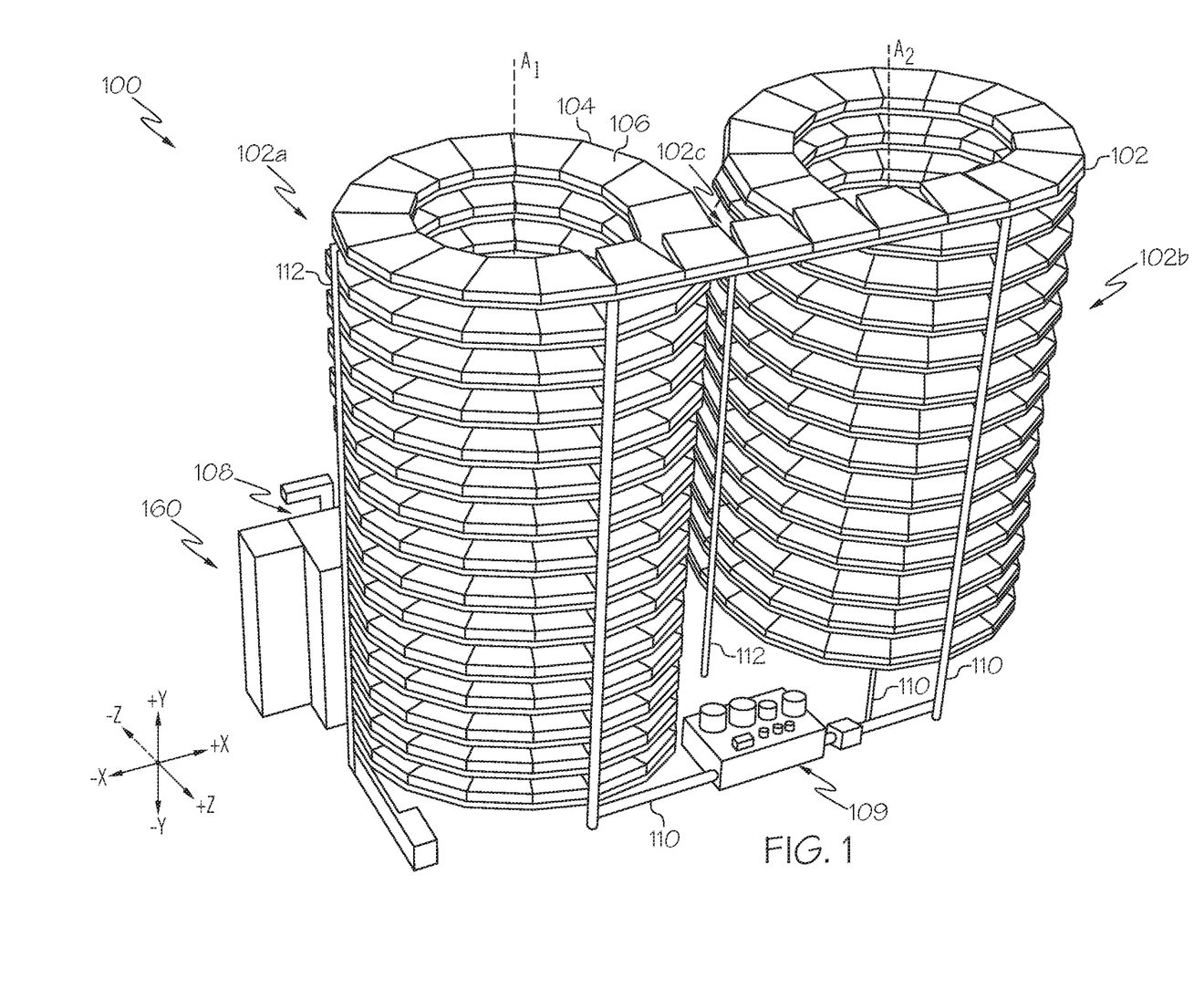
FIG. 1 schematically depicts a front perspective view of an illustrative assembly line grow pod having a master controller according to one or more embodiments shown and described herein.
Figure 2:
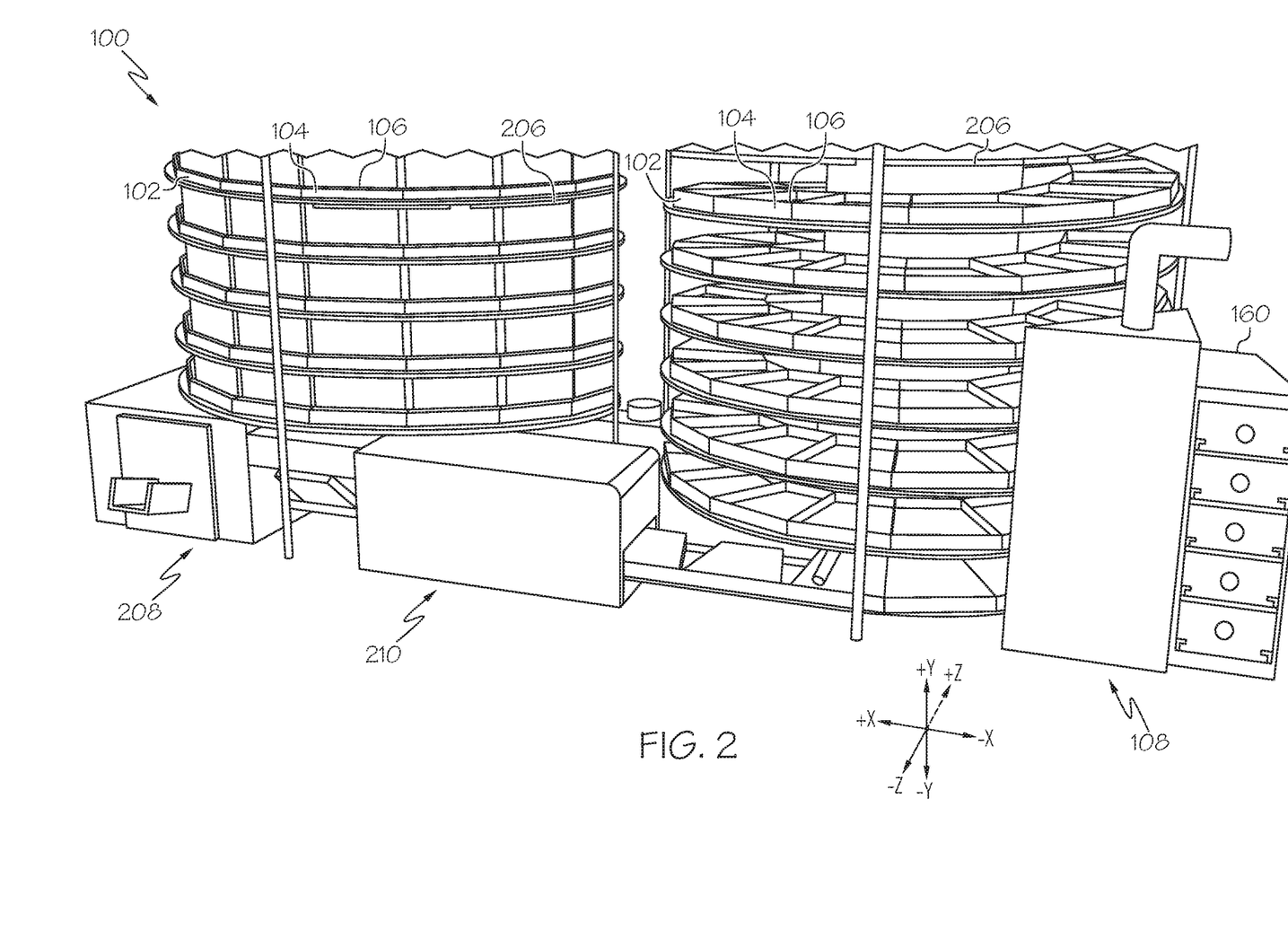
FIG. 2 schematically depicts a rear perspective view of a portion of an illustrative assembly line grow pod having a master controller according to one or more embodiments shown and described herein.

An illustrative industrial grow pod that allows for the continuous, uninterrupted growing of crops is depicted herein. Particularly, FIG. 1 depicts a front perspective view of an illustrative assembly line grow pod 100 having a master controller according to one or more embodiments shown and described herein. In addition, FIG. 2 depicts a rear perspective view of a portion of the assembly line grow pod 100. As illustrated in FIGS. 1 and 2, the assembly line grow pod 100 may include a track 102 that holds one or more carts 104. Referring particularly to FIG. 1, the track 102 may include at least an ascending portion 102a, a descending portion 102b, and a connection portion 102c. The track 102 may wrap around (e.g., in a counterclockwise direction, as shown in FIG. 1) a first axis $A_1$ such that the carts 104 ascend upward in a vertical direction (e.g., in the +y direction of the coordinate axes of FIG. 1). The connection portion 102c may be relatively level (although this is not a requirement) and is utilized to transfer carts 104 to the descending portion 102b. The descending portion 102b may be wrapped around a second axis $A_2$ (e.g., in a counterclockwise direction, as shown in FIG. 1) that is substantially parallel to the first axis $A_1$, such that the carts 104 may be returned closer to a ground level.

It should be understood that while the embodiment of FIGS. 1 and 2 depict an assembly line grow pod 100 that wraps around a plurality of axes $A_1$, $A_2$, this is merely one example. Any configuration of assembly line or stationary grow pod may be utilized for performing the functionality described herein.

Referring to FIG. 1, supported on each one of the carts 104 is a tray 106. The tray 106 may generally contain one or more components for holding seeds as the seeds germinate and grow into plants as the cart 104 traverses the ascending portion 102a, the descending portion 102b, and the connection portion 102c of the track 102 of the assembly line grow pod 100. The seeds may be planted, allowed to grow, and then may be harvested by various components of the assembly line grow pod 100, as described in greater detail herein. In addition, the seeds (and thereafter the shoots and plants) within the trays 106 may be monitored, provided with water, nutrients, environmental conditions, light, and/or the like to facilitate growing.

Also depicted in FIGS. 1 and 2 is a master controller 160. The master controller 160 may include, among other things, control hardware for controlling various components of the assembly line grow pod 100, as described in greater detail herein. The master controller 160 may be arranged as a modular control interface that receives a plurality of hot-swappable control modules, as described in greater detail herein. One module in the master controller 160, which may be fixed or hot-swappable, contains the crop control hardware. It should be understood that the terms "crop control hardware" and "crop control module" may be used interchangeably herein.

Coupled to the master controller 160 is a seeder component 108. The seeder component 108 may be configured to place seeds in the trays 106 supported on the one or more carts 104 as the carts 104 pass the seeder component 108 in the assembly line. Depending on the particular embodiment, each cart 104 may include a single section tray 106 for receiving a plurality of seeds. Some embodiments may include a multiple section tray 106 for receiving individual seeds in each section (or cell). In the embodiments with a single section tray 106, the seeder component 108 may detect presence of the respective cart 104 and may begin laying seed across an area of the single section tray 106. The seed may be laid out according to a desired depth of seed, a desired number of seeds, a desired surface area of seeds, and/or according to other criteria. In some embodiments, the seeds may be pre-treated with nutrients and/or anti-buoyancy agents (such as water) as these embodiments may not utilize soil to grow the seeds and thus might need to be submerged.

In the embodiments where a multiple section tray 106 is utilized with one or more of the carts 104, the seeder component 108 may be configured to individually insert seeds into one or more of the sections of the tray 106. Again, the seeds may be distributed on the tray 106 (or into individual cells) according to a desired number of seeds, a desired area the seeds should cover, a desired depth of seeds, etc.

Referring to FIG. 1, the assembly line grow pod 100 may also include a watering component 109 coupled to one or more water lines 110 in some embodiments. The watering component 109 and the one or more water lines 110 may distribute water and/or nutrients to one or more trays 106 at particular areas of the assembly line grow pod 100. For example, the one or more water lines 110 may deliver water and/or nutrients to one or more watering stations arranged at particular locations within the assembly line grow pod 100. As a cart 104 passes a watering station, a particular amount of water may be provided to the tray 106 supported by the cart 104. For example, seeds may be sprayed at a watering station to reduce buoyancy and then flooded. Additionally, water usage and consumption may be monitored at a watering station and data may be generated that corresponds to such water usage and consumption. As such, when the cart 104 reaches a subsequent watering station along the track 102 in the assembly line grow pod 100, the data may be utilized to determine an amount of water to supply to the tray 106 at that time.

Also depicted in FIG. 1 are airflow lines 112. Specifically, the master controller 160 may include and/or be coupled to one or more components that delivers air to one or more portions of the assembly line grow pod 100. The air may be delivered, for example, to control a temperature of the assembly line grow pod 100 or an area thereof, a pressure of the air in the assembly line grow pod 100 or an area thereof, control a concentration of carbon dioxide ($CO_2$) in the air of the assembly line grow pod 100 or an area thereof, control a concentration of oxygen in the air of the assembly line grow pod 100 or an area thereof, control a concentration of nitrogen in the air of the assembly line grow pod 100 or an area thereof, and/or the like. Accordingly, the airflow lines 112 may distribute the airflow at particular areas in the assembly line grow pod 100 to facilitate control. In addition, sensors may sense characteristics (e.g., a concentration, a pressure, a temperature, flow velocity, and/or the like) and may generate data and/or signals corresponding to the sensed characteristics, which may be used for further control.

Referring to FIG. 2, additional components of the assembly line grow pod 100 are illustrated, including (but not limited to) one or more lighting devices 206, a harvester component 208, and a sanitizer component 210. As described above, the seeder component 108 may be configured to seed the trays 106 of the carts 104. Still referring to FIG. 2, the lighting devices 206 may provide light waves that may facilitate plant growth at various locations throughout the assembly line grow pod 100 as the carts 104 traverse the track 102. Depending on the particular embodiment, the lighting devices 206 may be stationary and/or movable. As an example, some embodiments may alter the position of the lighting devices 206, based on the plant type, stage of development, recipe, and/or other factors.

Additionally, as the plants are lighted, watered, and provided nutrients, the carts 104 traverse the track 102 of the assembly line grow pod 100. Additionally, the assembly line grow pod 100 may detect a growth and/or fruit output of a plant and may determine when harvesting is warranted. If harvesting is warranted prior to the cart 104 reaching the harvester component 208, modifications to a recipe may be made for that particular cart 104 until the cart 104 reaches the harvester component 208. Conversely, if a cart 104 reaches the harvester component 208 and it has been determined that the plants in that cart 104 are not ready for harvesting, the assembly line grow pod 100 may commission that cart 104 for another lap. This additional lap may include a different dosing of light, water, nutrients, etc. and the speed of the cart 104 could change, based on the development of the plants on the cart 104. If it is determined that the plants on a cart 104 are ready for harvesting, the harvester component 208 may harvest the plants from the trays 106.

Still referring to FIG. 2, the harvester component 208 may cut the plants at a particular height for harvesting in some embodiments. In some embodiments, the tray 106 may be overturned to remove the plants from the tray 106 and into a processing container for chopping, mashing, juicing, and/or the like. Because many embodiments of the assembly line grow pod 100 do not use soil, minimal (or no) washing of the plants may be necessary prior to processing.

Similarly, some embodiments may be configured to automatically separate fruit from the plant, such as via shaking, combing, etc. If the remaining plant material may be reused to grow additional fruit, the cart 104 may keep the remaining plant and return to the growing portion of the assembly line. If the plant material is not to be reused to grow additional fruit, it may be discarded or processed, as appropriate.

Once the cart 104 and tray 106 are clear of plant material, the sanitizer component 210 may remove any particulate matter, plant material, and/or the like that may remain on the cart 104. As such, the sanitizer component 210 may implement any of a plurality of different washing mechanisms, such as high pressure water, high temperature water, and/or other solutions for cleaning the cart 104 and/or the tray 106. In some embodiments, the tray 106 may be overturned to output the plant for processing and the tray 106 may remain in this position. As such, the sanitizer component 210 may receive the tray 106 in this position, which may wash the cart 104 and/or the tray 106 and return the tray 106 back to the growing position. Once the cart 104 and/or tray 106 are cleaned, the tray 106 may again pass the seeder component 108, which may determine that the tray 106 requires seeding and may begin the process placing seeds in the tray 106, as described herein.

It should be understood that the assembly line grow pod 100 may include additional components not specifically described herein, and the present disclosure is not limited solely to the components described herein. Illustrative additional components may include, but are not limited to, other watering components, other lighting components, other airflow components, growth monitoring components, other harvesting components, other washing and/or sanitizing components, and/or the like.

Control of the various components described hereinabove, as well as components of the assembly line grow pod 100 not specifically described herein, may be completed by a plurality of control modules within the master controller 160. Each control module within the master controller 160 may be particularly configured to control a single component, a plurality of components, portions of one or more components, and/or the like. For example, a control module may control one or more components that supply water, one or more components that supply nutrients, one or more components that adjust ambient air conditions, one or more components that adjust lighting, one or more components that provide seeds, one or more components that harvest plants, one or more components that clean trays, and/or one or more components that direct movement of carts on a track of the assembly line grow pod 100.

In some embodiments, control of various components of the assembly line grow pod 100 may be managed by a plurality of control modules such that if a particular control module is removed from the master controller 160, the remaining control modules within the master controller 160 can still control various functions of the assembly line grow pod 100 so as to avoid an instance where the entire assembly line grow pod 100 (or a portion of the assembly line grow pod 100) has to be shut down while a control module is removed, replaced, repaired, or the like. To ensure that the assembly line grow pod 100 continues to run even as a particular control module is removed from the master controller 160, the master controller 160 may include a crop control module that acts as an intermediary module, sending and receiving signals from the various components of the assembly line grow pod 100 and relaying such signals between the appropriate control module(s) within the master controller 160. In some embodiments, the crop control module may include computer hardware and software components that utilize scripting language to translate recipes and other instructions that are received into binary signals that can be transmitted to the other control modules included within the master controller 160. For example, if a determination is made that a particular tray 106 is to be watered by a watering device (e.g., a fluid distribution manifold) and that the tray 106 is passing in a particular period of time, the crop control module may determine what components are needed, prepare binary signals, and relay the binary signals to the various other control modules that control watering at the time at which watering is necessary. Other particular details regarding the functionality of the crop control module will be discussed herein with respect to FIG. 9.

While the present disclosure generally relates to a hot swappable or removably insertable crop control module (as described hereinbelow), the present disclosure is not restricted to such. In some embodiments, the crop control module may be fixed within the master controller 160 such that it is not removably insertable or hot swappable like the various other modules. As such, the crop control module may always be available to function to control signal relays to and from the various components of the assembly line grow pod 100 and/or the various control modules within the master controller 160.

Figure 3:
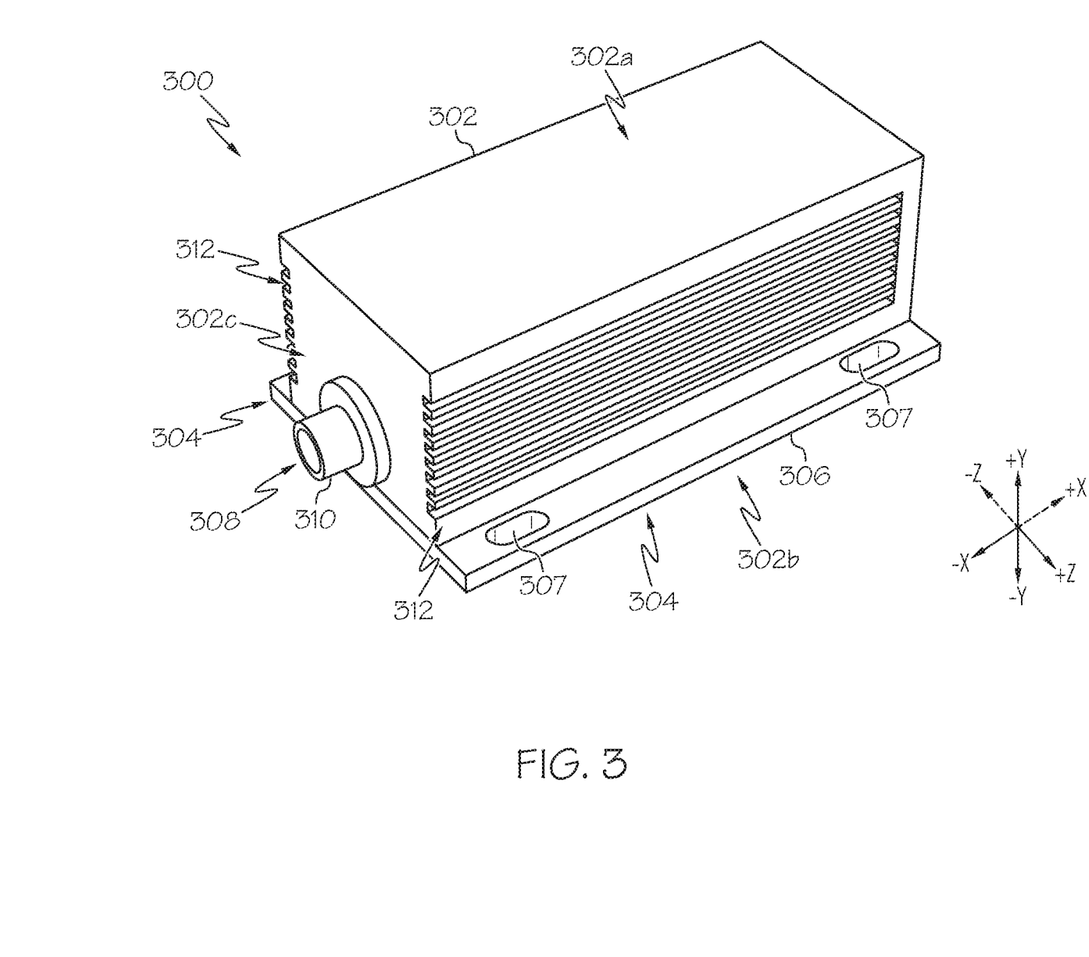
FIG. 3 schematically depicts a side perspective view of an illustrative crop control module according to one or more embodiments shown and described herein.

FIG. 3 depicts a side perspective view of an illustrative crop control module 300 according to various embodiments. The crop control module 300 may generally include a housing 302 supported on a base 306. The base 306 may support the housing 302 within the master controller 160 (FIG. 2), as described in greater detail herein. Still referring to FIG. 3, the housing 302 of the crop control module may include a plurality of walls, such as, for example, a first side wall 302*a*, a second side wall 302*b*, and a third side wall 302*c*. The first side wall 302*a*, the second side wall 302*b*, and the third side wall 302*c* may extend from the base 306 and at least partially define a cavity that contains various internal components of the crop control module, as described in greater detail herein.

In various embodiments, the crop control module 300 may further include an I/O port 308 within the housing 302. The I/O port 308 may have a body 310 that extends from the housing 302 (e.g., from the third side wall 302*c* of the housing 302) and allows the various internal hardware components of the crop control module 300 to be coupled to external components, such as, for example, various components of the assembly line grow pod 100 (FIG. 1), including (but not limited to) the master controller 160 (FIG. 2). Still referring to FIG. 3, the body 310 of the I/O port 308 may be shaped, sized, and configured to couple to a corresponding bay I/O port to facilitate communicative coupling between the crop control module 300 and the various components of the assembly line grow pod 100 (FIG. 1), including (but not limited to) the master controller 160. For example, the body 310 of the I/O port 308 may have a shape that corresponds to a receptacle in a bay I/O port such that the body 310 can be inserted within the bay I/O port. Still referring to FIG. 3, the I/O port 308 may be a communications port or the like that contains circuitry and/or other mechanical coupling components that allow various hardware components within the crop control module 300 to communicate with one or more other control modules and/or one or more of the various components of the assembly line grow pod 100 (FIG. 1) via the master controller 160 (FIG. 2), as described in greater detail herein.

In various embodiments, the crop control module 300 may further include one or more features for securing the crop control module 300 to another object, such as, for example, a bay in the master controller 160 (FIG. 2). For example, the base 306 of the crop control module 300 may extend a distance beyond the various side walls of the housing 302 (e.g., extend beyond the first side wall 302*a* and the second side wall 302*b* in the +z/−z directions of the coordinate axes of FIG. 3) to define a plurality of flanges 304 that are insertable into a support mechanism or the like, as described in greater detail herein. The flanges 304 may include one or more structures for securing the base 306 of the crop control module 300. For example, the flanges 304 may include a plurality of apertures 307 therethrough, as shown in FIG. 3. The plurality of apertures 307 may receive a retention device, such as a screw, a bolt, a clip, and/or the like to secure the base 306, as described in greater detail herein. It should be understood that the apertures 307 are merely an illustrative example of one type of feature that may be used to secure the base 306, and the present disclosure is not limited to such. That is, other securing features are also contemplated and included within the scope of the present disclosure. It should also be understood that the apertures 307 are optional components, and the base 306 may be secured by other means or may not be secured at all in some embodiments.

The various internal components of the crop control module 300 may produce heat as a byproduct of operation. As such, the crop control module 300 may incorporate one or more cooling features therein to dissipate the heat generated by the internal components thereof in some embodiments. For example, the housing 302 of the crop control module 300 may include one or more heat dissipating fins 312 disposed thereon in some embodiments. That is, the first side wall 302*a* and/or the second side wall 302*b* may each include the heat dissipating fins 312. Other features for dissipating heat may also be used in addition to (or as an alternative to) the heat dissipating fins 312.

Figure 4:
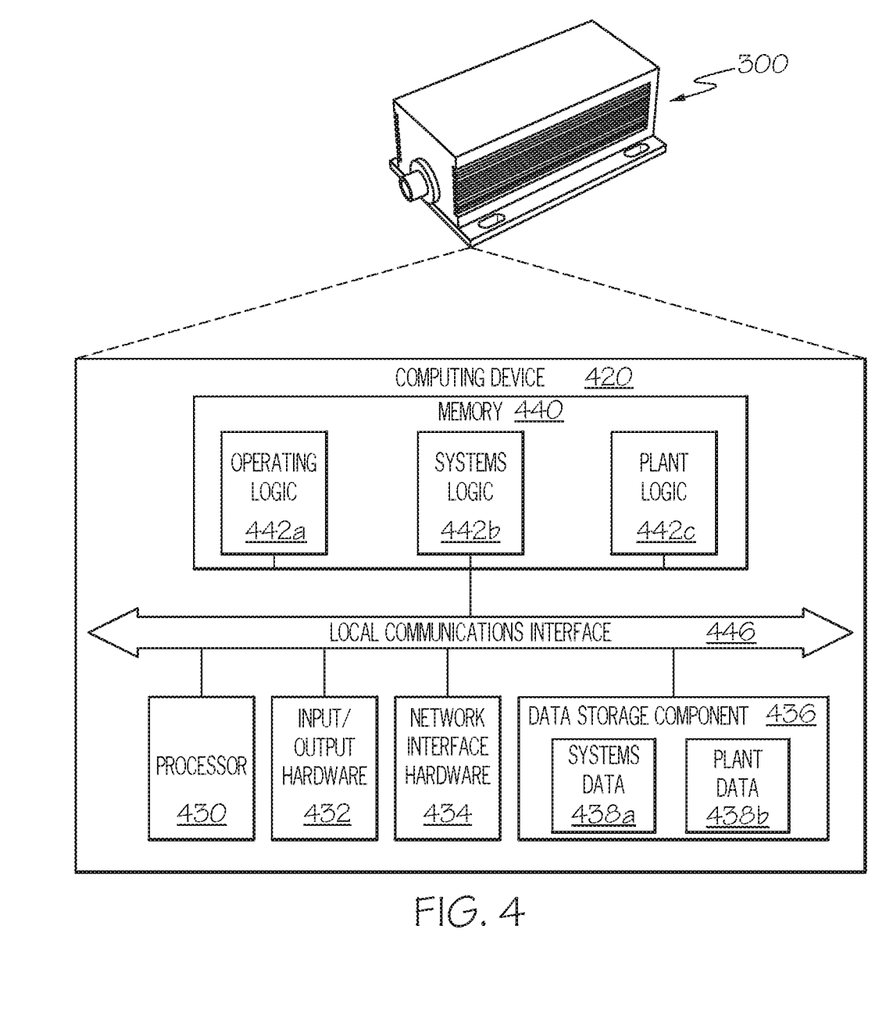
FIG. 4 depicts an illustrative computing environment within a crop control module according to one or more embodiments shown and described herein.

The various internal components of the crop control module 300 may generally provide the functionality of the crop control module 300, as described herein. That is, the internal components of the crop control module 300 may be a computing environment. FIG. 4 depicts an illustrative computing environment within the crop control module 300 according to various embodiments. As illustrated in FIG. 4, the crop control module 300 may include a computing device 420. The computing device 420 includes a memory component 440, a processing device 430, input/output hardware 432, network interface hardware 434, and a data storage component 436 (which stores systems data 438a, plant data 438b, and/or other data).

At least a portion of the components of the computing device 420 may be communicatively coupled to a local interface 446. The local interface 446 is generally not limited by the present disclosure and may be implemented as a bus or other communications interface to facilitate communication among the components of the crop control module 300 coupled thereto.

The memory component 440 may be configured as volatile and/or nonvolatile memory. As such, the memory component 440 may include random access memory (including SRAM, DRAM, and/or other types of RAM), flash memory, secure digital (SD) memory, registers, compact discs (CD), digital versatile discs (DVD), Blu-Ray discs, and/or other types of non-transitory computer-readable mediums. Depending on the particular embodiment, these non-transitory computer-readable mediums may reside within the crop control module 300 and/or external to the crop control module 300. The memory component 440 may store, for example, operating logic 442a, systems logic 442b, and plant logic 442c. The operating logic 442a, the systems logic 442b, and the plant logic 442c may each include a plurality of different pieces of logic, at least a portion of which may be embodied as a computer program, firmware, and/or hardware, as an example.

The operating logic 442a may include an operating system and/or other software for managing components of the crop control module 300. As described in more detail below, the systems logic 442b may monitor and control operations of one or more of the various other control modules and/or one or more components of the assembly line grow pod 100 (FIG. 1). Still referring to FIG. 4, the plant logic 442c may be configured to determine and/or receive a recipe for plant growth and may facilitate implementation of the recipe via the systems logic 442b.

It should be understood that while the various logic modules are depicted in FIG. 4 as being located within the memory component 440, this is merely an example. For example, the systems logic 442b and the plant logic 442c may reside on different computing devices. That is, one or more of the functionalities and/or components described herein may be provided by a user computing device and/or a remote computing device that is communicatively coupled to the crop control module 300.

Additionally, while the computing device 420 is illustrated with the systems logic 442b and the plant logic 442c as separate logical components, this is also an example. In some embodiments, a single piece of logic (and/or or several linked modules) may cause the computing device 420 to provide the described functionality.

The processing device 430 may include any processing component operable to receive and execute instructions (such as from the data storage component 436 and/or the memory component 440). Illustrative examples of the processing device 430 include, but are not limited to, a computer processing unit (CPU), a many integrated core (MIC) processing device, an accelerated processing unit (APU), a digital signal processor (DSP). In some embodiments, the processing device 430 may be a plurality of components that function together to provide processing capabilities, such as integrated circuits (including field programmable gate arrays (FPGA)) and the like.

The input/output hardware 432 may include and/or be configured to interface with microphones, speakers, a display, and/or other hardware. That is, the input/output hardware 432 may interface with hardware that provides a user interface or the like. For example, a user interface may be provided to a user for the purposes of adjusting settings (e.g., a speed of the carts 104 on the track 102 (FIG. 1), a number of seeds to be deposited, an amount of nutrients/water to be supplied, an amount of light to be supplied, etc.), viewing a status (e.g., receiving a notification of an error, a status of a component, etc.), and/or the like.

Still referring to FIG. 4, the network interface hardware 434 may include and/or be configured for communicating with any wired or wireless networking hardware, including an antenna, a modem, LAN port, wireless fidelity (Wi-Fi) card, WiMax card, ZigBee card, Z-Wave card, Bluetooth chip, USB card, mobile communications hardware, and/or other hardware for communicating with other networks and/or devices. From this connection, communication may be facilitated between the crop control module 300 and other components of the assembly line grow pod 100 (FIG. 1), such as, for example, other control modules, the seeder component, the harvesting component, the watering component, and/or the like. In some embodiments, the network interface hardware 434 may also facilitate communication between the crop control module and components external to the assembly line grow pod 100, such as, for example, user computing devices and/or remote computing devices. As such, the network interface hardware 434 may be communicatively coupled to the I/O port 308 of the crop control module 300 (FIG. 3).

Still referring to FIG. 4, the crop control module 300 may be coupled to a network via the network interface hardware 434. The network may include the internet or other wide area network, a local network, such as a local area network, or a near field network, such as Bluetooth or a near field communication (NFC) network. Various other control modules, other computing devices, and/or the like may also be coupled to the network. Illustrative other computing devices include, for example, a user computing device and a remote computing device. The user computing device may include a personal computer, laptop, mobile device, tablet, server, etc. and may be utilized as an interface with a user. As an example, a user may send a recipe to the computing device 420 for at least a partial implementation by the crop control module 300. Another example may include the crop control module 300 sending notifications to a user of the user computing device.

Similarly, the remote computing device may include a server, personal computer, tablet, mobile device, etc. and may be utilized for machine to machine communications. As an example, if the assembly line grow pod 100 (FIG. 1) determines a type of seed being used (and/or other information, such as ambient conditions), the computing device 420 may communicate with the remote computing device to retrieve a previously stored recipe for those conditions. As such, some embodiments may utilize an application program interface (API) to facilitate this or other computer-to-computer communications.

Still referring to FIG. 4, the data storage component 436 may generally be any medium that stores digital data, such as, for example, a hard disk drive, a solid state drive (SSD), a compact disc (CD), a digital versatile disc (DVD), a Blu-Ray disc, and/or the like. It should be understood that the data storage component 436 may reside local to and/or remote from the crop control module 300 and may be configured to store one or more pieces of data and selectively provide access to the one or more pieces of data. As illustrated in FIG. 4, the data storage component 436 may store systems data 438a, plant data 438b, and/or other data. The systems data 438a may generally include data relating to the functionality of the crop control module 300, such as stored settings, information regarding the location of the crop control module 300 and/or other modules within the master controller 160 (FIG. 2), and/or the like. The plant data 438b may generally relate to recipes for plant growth, settings of various components within the assembly line grow pod 100 (FIG. 1), sensor data relating to a particular tray or cart, and/or the like.

It should be understood that while the components in FIG. 4 are illustrated as residing within the crop control module 300, this is merely an example. In some embodiments, one or more of the components may reside external to the crop control module 300. It should also be understood that, while the crop control module 300 is illustrated as a single device, this is also merely an example. That is, the crop control module 300 may be a plurality of devices that are communicatively coupled to one another and provide the functionality described herein.

Figure 5:
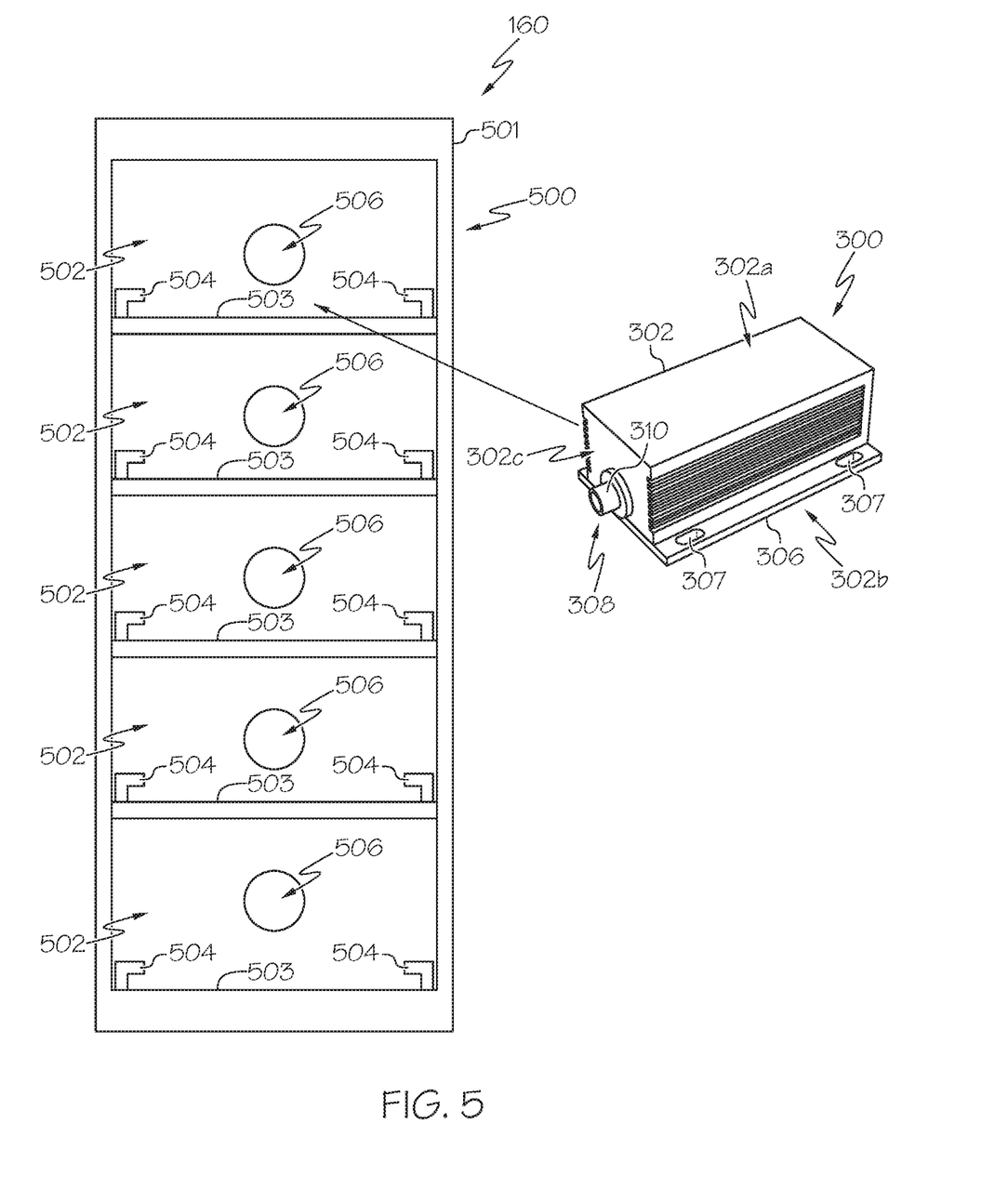
FIG. 5 schematically depicts an illustrative modular control interface of a master controller that receives a crop control module according to one or more embodiments shown and described herein.

FIG. 5 schematically depicts an illustrative modular control interface 500 of a master controller 160 that receives a crop control module 300 according to various embodiments. As illustrated, the master controller 160 may be configured with a modular control interface 500 that can support the crop control module 300 and/or one or more other control modules. As such, the master controller 160 may include a plurality of bays 502 in which the crop control module 300 can be placed. Each bay 502 is generally a cavity within a body 501 of the master controller 160 that is sized and shaped to receive any control module, including the crop control module 300. In addition, each bay 502 may have the same or substantially similar shape and size as the other bays 502 of the master controller 160 such that the crop control module 300 and/or other modules can be inserted in any bay 502. That is, no bay 502 is particularly shaped to only accept the crop control module 300 and there is no bay that cannot accept the crop control module 300.

Figure 6:
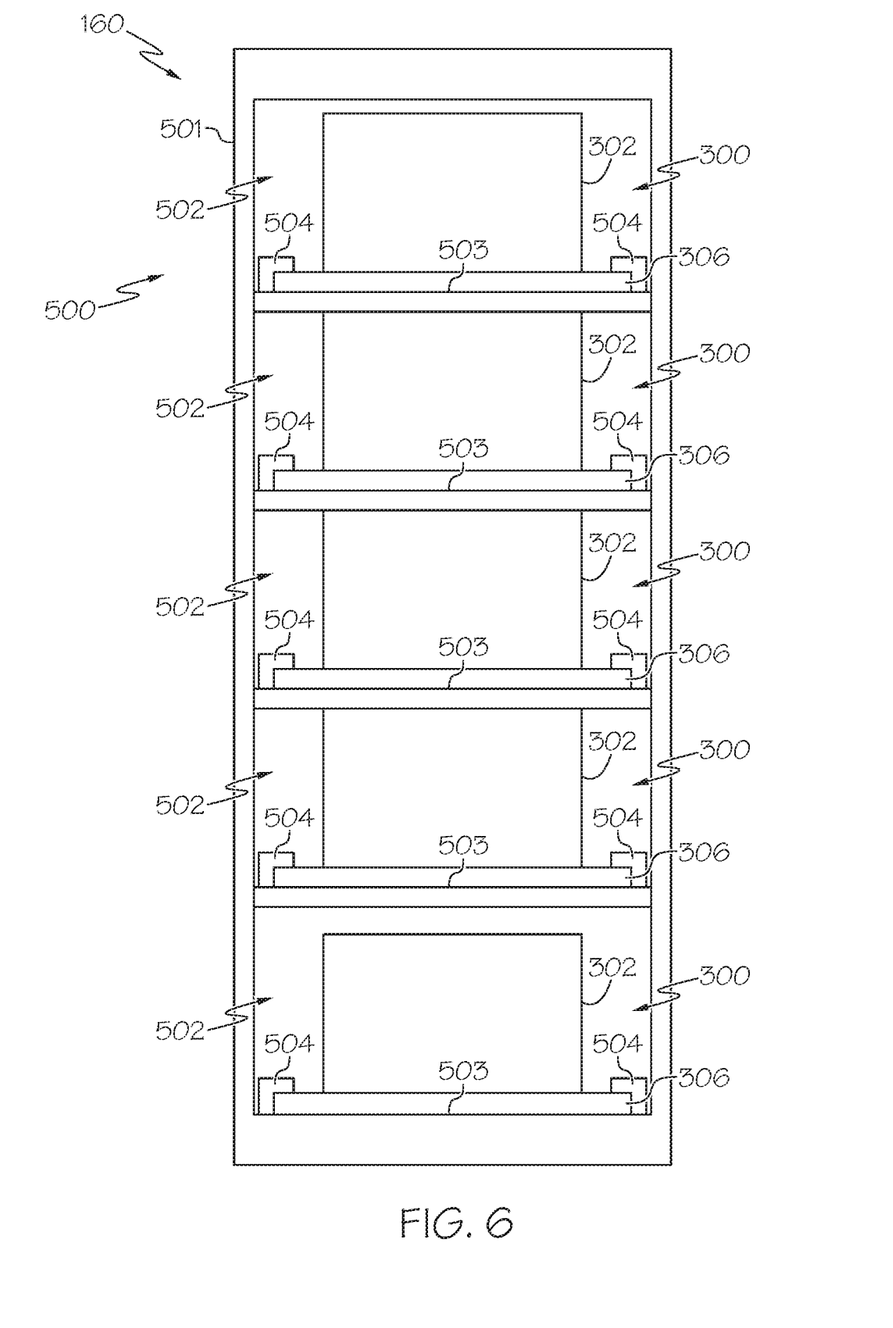
FIG. 6 schematically depicts an illustrative master controller holding a plurality of illustrative control modules according to one or more embodiments shown and described herein.

At least some of the plurality of bays 502 may further include a floor 503 and/or a support mechanism 504. The floor 503 may generally be a lower surface of each bay 502 that supports the crop control module 300 when placed therein. As such, each floor 503 may be part of the body 501 of the master controller 160. In some embodiments, the support mechanism 504 may be a rail or the like that supports the base 306 of the crop control module 300 when the crop control module 300 is inserted into a respective bay. In addition, the support mechanism 504 may also act as a guide to ensure that the crop control module 300 is appropriately inserted and positioned within the bay 502. For example, as depicted in FIG. 6, at least some of the support mechanisms 504 in each bay 502 accepts the corresponding base 306 of the crop control module 300 such that the crop control module 300 slides into the bay 502 in the correct positioning and ensures that the I/O port 308 is appropriately positioned, as described hereinbelow.

Referring again to FIG. 5, the support mechanisms 504 may further be arranged, shaped, and sized to hold the crop control module 300 in place when the crop control module 300 is placed within a bay 502 in some embodiments. In addition, the support mechanisms 504 may further be molded to receive a securing device to secure the crop control module 300 within the bay 502 (e.g., clips, bolts, screws, and/or the like that are inserted into the apertures 307 in the base 306 and affixed to (or integrated with) the support mechanisms 504). It should be understood that the particular arrangement and configuration of the support mechanisms 504 and the bases 306 are merely illustrative, and other means of ensuring that the crop control module 300 is appropriately placed and positioned within the bay 502 are possible without departing from the scope of the present disclosure.

Still referring to FIG. 5, at least a portion of the plurality of bays 502 may further include a bay I/O port 506. The bay I/O port 506 may correspond to the I/O port 308 of the crop control module 300 such that the bay I/O port 506 and the I/O port 308 of the crop control module 300 can be matingly coupled together. For example, the bay I/O port 506 may be shaped and/or sized to correspond to the body 310 of the I/O port 308 such that the I/O port 308 is insertable within the bay I/O port 508 (e.g., the bay I/O port 506 is generally the same or substantially similar shape and slightly larger than the body 310 of the I/O port 308). In embodiments, the bay I/O port 506 may contain various communications components such that, when the bay I/O port 506 is mated to the I/O port 308 of the crop control module 300, communications between the crop control module 300 and other devices communicatively coupled via the bay I/O port 506 can occur. For example, the bay I/O port 506 may allow the crop control module 300 to send and/or receive transmissions to/from the various other control modules and/or one or more components of the assembly line grow pod 100 (FIG. 1) via the I/O port 308.

The circuitry contained within each of the bay I/O ports 506 may be communicatively coupled to various other components of the master controller 160 such that signals, data, and/or the like can be transmitted to the master controller 160, other control modules, and/or one or more components of the assembly line grow pod 100 (FIG. 1) by the crop control module 300 when the crop control module 300 is inserted in one of the bays 502 of the master controller 160 and the bay I/O port 506 and the I/O port 308 are coupled together.

Figure 7:
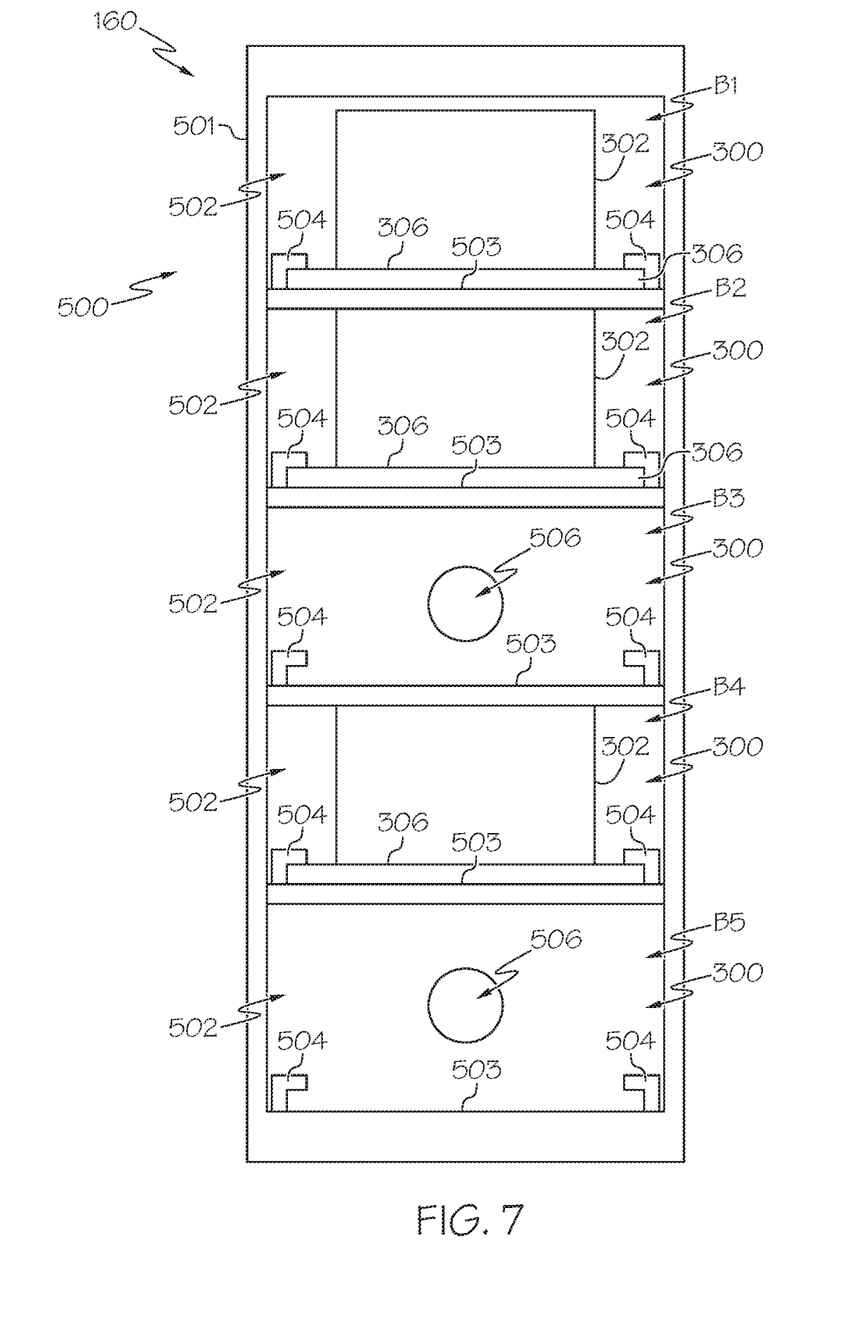
FIG. 7 schematically depicts an illustrative master controller holding a plurality of illustrative control modules and having a plurality of empty bays according to one or more embodiments shown and described herein.

Since at least some of the bays 502 are identical (or substantially similar) in shape and size and contain similar components (e.g., floors 503, support mechanisms 504, and bay I/O ports 506), the crop control module 300 can be placed in any one of the bays 502 in order to operate. Certain bays 502 may remain vacant and ready to accept any control module, as depicted in FIG. 7.

It should be understood that the various components of the master controller 160 described herein allow the crop control module 300 (in addition to other control modules) to be hot swappable (which may also be referred to herein as "removably insertable") within the master controller 160. That is, the crop control module 300 can be inserted into a bay 502 of the master controller 160 at any time to function. Furthermore, removal of the crop control module 300 from a bay 502 will not alter the functionality of other control modules inserted in other bays 502. As such, a user may remove the crop control module 300 from a bay 502 at any time without altering the functionality of the remaining installed control modules. Similarly, another control module may be removed while the crop control module 300 remains in a bay 502 and the crop control module 300 will continue to function as described herein. This may be particularly useful in situations where it may be necessary to remove a control module from a bay 502 without shutting down the entire assembly line grow pod 100 (FIG. 1) to do so.

It should also be understood that the master controller 160 need not have all of the bays 502 filled with a control module to operate the assembly line grow pod 100. For example, as particularly shown in FIG. 7, a portion of the bays 502 may be "filled" bays (e.g., containing a control module such as the crop control module 300), such as bays B1, B2, and B4. Likewise, a portion of the bays 502 may be "empty" bays (e.g., not containing a control module), such as bays B3 and B4. Even with empty bays B3 and B4, the master controller 160 may still be able to provide all of the functionality for the assembly line grow pod 100 (FIG. 1), as described herein. Empty bays B3 and B4 may be used to insert future control modules, such as modules that control additional components that are added to the assembly line grow pod 100 (FIG. 1) and/or modules that increase the efficiency of operation of the assembly line grow pod 100.

Figure 8:
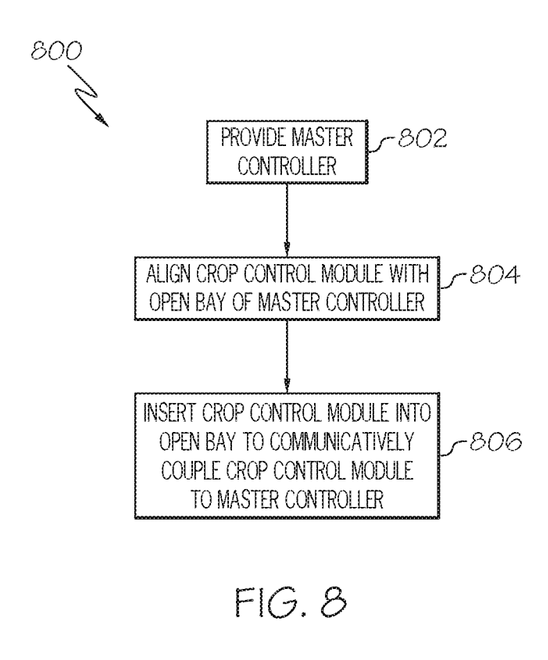
FIG. 8 depicts a flow diagram of an illustrative method of providing a crop control module for a modular control interface according to one or more embodiments shown and described herein.

FIG. 8 depicts a flow diagram of an illustrative method of providing a crop control module for a modular control interface, generally designated 800, according to various embodiments. Referring also to FIGS. 1-5, the method 800 includes providing the master controller 160 at block 802. At block 804, a crop control module 300 is aligned with an open bay 502 of the master controller 160, as described in greater detail herein. Accordingly, the crop control module 300 is inserted within the open bay 502 of the master controller 160 so as to be communicatively coupled with the master control module at block 804, as described in greater detail herein.

Figure 9:
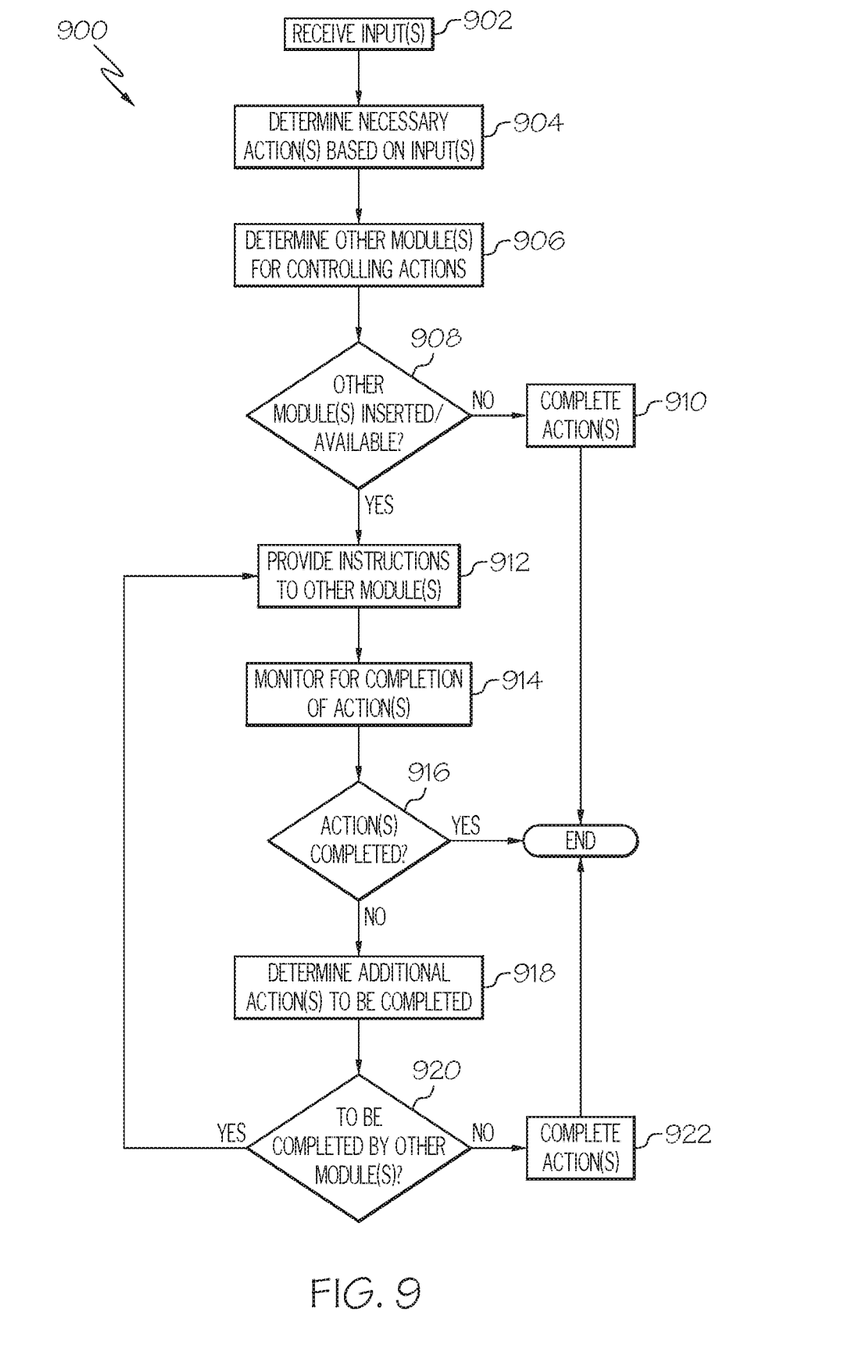
FIG. 9 depicts a flow diagram of an illustrative method of operating an assembly line grow pod with a crop control module in a master controller according to one or more embodiments shown and described herein.

Once inserted, the crop control module 300 may complete one or more processes to operate the assembly line grow pod 100 and/or a component thereof. FIG. 9 depicts a flow diagram of an illustrative method of operating an assembly line grow pod 100 with a crop control module 300 in a master controller 160, generally designated 900, according to one or more embodiments. At block 902, the crop control module 300 may receive one or more inputs. For example, the crop control module 300 may receive a command from a user, data from one or more sensors, an input from another control device, and/or the like. Illustrative examples of one or more inputs include, but are not limited to, inputs that relate to commands to start or stop movement of the assembly line grow pod 100 (or a portion thereof), inputs that relate to commands to carry out a particular recipe, inputs that relate to commands to change settings of various components of the assembly line grow pod 100, sensor inputs from various sensors regarding the status of the assembly line grow pod 100, components thereof, and/or plants growing within the grow pod, inputs relating to commands from other control devices, and/or the like.

At block 904, the crop control module 300 determines the necessary actions to be completed based on the inputs that were received at block 902. The actions may generally be one or more instructions, signals, or the like for operation of the assembly line grow pod 100. For example, if the input relates to a command to start movement of the assembly line grow pod 100 or a portion thereof, the crop control module 300 may determine that the actions include transmitting one or more signals to component(s) of the assembly line grow pod 100 to activate. In some embodiments, such actions may be completed by other control modules located within the master controller 160. For example, a valve control module may be inserted in a bay 502 of the master controller 160, and thus an action that corresponds to opening or closing valves would be completed by the valve control module instead of the crop control module 300. Accordingly, the crop control module 300 may determine other module(s) for controlling actions at block 906. Such a determination may be completed, for example, by recognizing certain module(s) that can complete the action, and then determining at block 908 whether any of those certain modules are located within the master controller 160 (e.g., by pinging a network to determine which modules are connected). Other methods for determining may also be completed without departing from the scope of the present disclosure. If no other module(s) are inserted or available to control the actions, the process may continue at block 910. If other module(s) are inserted or available to control the actions, the process may continue at block 912.

At block 910, the crop control module 300 may complete the determined actions when no other module(s) are inserted or available to complete the actions. For example, if the determined action is to open a particular valve and no valve control module (or other control module that can also control valves) is inserted or available within the master controller 160, the crop control module 300 may transmit a signal to cause the valve to open.

At block 912, instructions are provided to the other module(s) for carrying out the determined action(s). For example, the crop control module 300 may transmit one or more signals to the other module(s), where the one or more signals correspond to the command. In addition, the crop control module 300 may monitor one or more portions of the assembly line grow pod 100 to ensure the action(s) are completed by the other modules at block 914. That is, the crop control module 300 may receive signals and/or data from sensors, from portions of the assembly line grow pod 100, from the master controller 160, from the other control modules, and/or the like that are indicative of whether the action(s) were completed. For example, if an action included closing a particular valve, the crop control module 300 may receive sensor data from sensors at the valve or downstream from the valve, where the sensor data indicates whether a flow of water from the valve exists. Data indicating that a water flow does exist may be used by the crop control module 300 to determine that the valve was not closed. As such, the crop control module may determine at block 916 whether the action(s) were completed. If the actions were completed, the process may end. If the actions were not completed, the process may proceed to block 918.

At block 918, the crop control module 300 may determine additional action(s) to be completed. These additional actions may generally be actions to replace those that were not completed above. As such, the action(s) may be the same or substantially similar (e.g., transmitting a signal to a valve corresponding to a command to close the valve) in some embodiments. However, the actions may also be different in other embodiments. For example, new actions may be determined if only a portion of the actions were carried out. In another example, new alternative actions may be determined if the failure to carry out an action was due to a faulty component, thus necessitating the need for a redundant system to carry out particular actions. Accordingly, the crop control module 300 may determine again whether these new actions are to be completed by other control modules within the master controller 160. If so, the process may repeat at block 912. If not, the crop control module 300 may complete the actions at block 922 and the process may end.

As illustrated above, various embodiments for providing a crop control module for a modular control interface in an assembly line grow pod are disclosed. These embodiments create a general control interface that provides signals to and/or receives signals from any one of the various components of the assembly line grow pod, including other control modules.

Accordingly, some embodiments may include crop control hardware for a modular control interface in an assembly line grow pod that includes a master controller having a plurality of identical bays, at least a portion of which can receive a crop control module. The crop control module is configured to transmit and/or receive signals to/from various other components of the assembly line grow pod, including other control modules, for the purposes of ensuring that the assembly line grow pod (and components thereof) continues to function even when certain control modules are removed from the master controller.

While particular embodiments and aspects of the present disclosure have been illustrated and described herein, various other changes and modifications can be made without departing from the spirit and scope of the disclosure. Moreover, although various aspects have been described herein, such aspects need not be utilized in combination. Accordingly, it is therefore intended that the appended claims cover all such changes and modifications that are within the scope of the embodiments shown and described herein.

It should now be understood that embodiments disclosed herein include systems, methods, and non-transitory computer-readable mediums for providing crop control hardware for a modular control interface in an assembly line grow pod. It should also be understood that these embodiments are merely exemplary and are not intended to limit the scope of this disclosure.

What is claimed is:

1. An assembly line grow pod comprising:
a master controller comprising a plurality of bays, the master controller communicatively coupled to one or more components of the assembly line grow pod;
a crop control module received within a first bay of the plurality of bays of the master controller such that the crop control module is communicatively coupled to the master controller and the one or more components of the assembly line grow pod; and
a second control module in a second bay of the plurality of bays, the second control module being removably insertable such that the second control module is removable from the second bay of the plurality of bays without altering a functionality of the assembly line grow pod,
wherein the crop control module is programmed to sense a removal of the second control module, determine one or more control signals necessary to maintain an operation of the assembly line grow pod and the one or more components of the assembly line grow pod, and provide the one or more control signals to the assembly line grow pod or the one or more components of the assembly line grow pod on behalf of the second control module.

2. The assembly line grow pod of claim 1, wherein the crop control module is removably insertable such that the crop control module is removable from the first bay of the plurality of bays without altering a functionality of the assembly line grow pod or the one or more components of the assembly line grow pod.

3. The assembly line grow pod of claim 1, wherein the crop control module is fixed within the first bay of the plurality of bays of the master controller such that the crop control module is not removable from the master controller.

4. The assembly line grow pod of claim 1, wherein the second control module controls components that supply water, components that supply nutrients, components that adjust ambient air conditions, components that adjust lighting, components that provide seeds, components that harvest plants, components that clean trays, or components that direct movement of carts on a track of the assembly line grow pod.

5. The assembly line grow pod of claim 1, further comprising:
a track; and
a plurality of carts supporting trays, the plurality of carts movable along the track,
wherein one or more control modules in the master controller provides one or more control signals to the plurality of carts to cause movement of the plurality of carts along the track.

6. The assembly line grow pod of claim 1, further comprising:
one or more lighting devices;
a seeder component;
a harvester component; and
a sanitizer component,
wherein one or more control modules in the master controller provides one or more control signals to the one or more lighting devices, the seeder component, the harvester component, and the sanitizer component.

7. A master controller in an assembly line grow pod, the master controller comprising:
a plurality of bays, each one of the plurality of bays comprising a bay I/O port that is communicatively coupled to one or more components of the assembly line grow pod; and
a crop control module received within a first bay of the plurality of bays of the master controller, the crop control module comprising:
an I/O port communicatively coupled to the bay I/O port,
a processing device, and
a non-transitory, processor-readable storage medium comprising one or more programming instructions stored thereon that, when executed, cause the processing device to:
receive an input,
determine an action to be completed based on the input, wherein the action comprises providing one or more instructions or signals for operation of the one or more components of the assembly line grow pod,
determine a second control module within a second bay of the plurality of bays for completing the action,
transmit an instruction to the second control module, the instruction directing the second control module to complete the action,
receive a second input;
determine a second action to be completed based on the second input, wherein the second action comprises providing one or more second instructions or signals for operation of the one or more components of the assembly line grow pod, determine that no other control module is available or exists within the plurality of bays for completing the second action; and
complete the second action.

8. The master controller of claim 7, wherein the one or more programming instructions, when executed, further cause the processing device to:
receive one or more signals or data from the one or more components of the assembly line grow pod;
determine that the action has not been completed by the second control module; and
determine a third action to be completed based on the input wherein the third action comprises providing one or more additional instructions or additional signals for operation of the one or more components of the assembly line grow pod.

9. The master controller of claim 8, wherein the one or more programming instructions, when executed, further cause the processing device to:
determine a third control module within one of the plurality of bays for completing the third action, and
transmit a third instruction to the third control module, the third instruction directing the third control module to complete the third action.

10. The master controller of claim 8, wherein the one or more programming instructions, when executed, further cause the processing device to:
determine that no other control module is available or exists within the plurality of bays for completing the third action; and
complete the third action.

11. The master controller of claim 7, wherein the crop control module comprises a housing supported on a base, the housing comprising the processing device and the non-transitory, processor-readable storage medium.

12. The master controller of claim 11, further comprising a support mechanism in the first bay of the plurality of bays, the support mechanism supporting the base of the crop control module.

13. The master controller of claim 7, wherein the crop control module is removably insertable such that the crop control module is removable from the first bay of the plurality of bays without altering a functionality of the assembly line grow pod or the one or more components of the assembly line grow pod.

14. The master controller of claim 7, wherein the crop control module is fixed within the first bay of the plurality of bays of the master controller such that the crop control module is not removable from the master controller.

15. The master controller of claim 7, further comprising the control module, wherein the control module is removably insertable such that the control module is removable from the second bay of the plurality of bays without altering a functionality of the assembly line grow pod.

16. A master controller in an assembly line grow pod, the master controller comprising:
a plurality of bays, each one of the plurality of bays comprising a bay I/O port that is communicatively coupled to one or more components of the assembly line grow pod; and
a crop control module received within a first bay of the plurality of bays of the master controller, the crop control module comprising:
an I/O port communicatively coupled to the bay I/O port,
a processing device, and
a non-transitory, processor-readable storage medium comprising one or more programming instructions stored thereon that, when executed, cause the processing device to:
receive an input,
determine an action to be completed based on the input, wherein the action comprises providing one or more instructions or signals for operation of the one or more components of the assembly line grow pod,
determine that no other control module is available or exists within one of the plurality of bays for completing the action, and
complete the action.

17. The master controller of claim 16, wherein the one or more programming instructions, when executed, further cause the processing device to:
receive a second input;
determine a second action to be completed based on the second input, wherein the second action comprises providing one or more second instructions or second signals for operation of the one or more components of the assembly line grow pod;
determine a control module within a second bay of the plurality of bays for completing the second action, and
transmit a control instruction to the control module, the control instruction directing the control module to complete the second action.

18. The master controller of claim 16, wherein:
the crop control module comprises a housing supported on a base, the housing comprising the processing device and the non-transitory, processor-readable storage medium; and
the master controller further comprises a support mechanism in the first bay of the plurality of bays, the support mechanism supporting the base of the crop control module.

19. The master controller of claim 16, wherein the crop control module is removably insertable such that the crop control module is removable from the first bay of the plurality of bays without altering a functionality of the assembly line grow pod or the one or more components of the assembly line grow pod.

* * * * *